(12) United States Patent
Buckman et al.

(10) Patent No.: US 9,992,911 B1
(45) Date of Patent: Jun. 5, 2018

(54) CONTROLLABLE CONDUCTANCE THERMAL INTERFACE

(71) Applicant: NORTHROP GRUMMAN SYSTEMS CORPORATION, Falls Church, VA (US)

(72) Inventors: Clint G. Buckman, Torrance, CA (US);
Alex Chov, Simi Valley, CA (US);
Matthew Kim, Los Angeles, CA (US);
Hamahito Hokyo, Santa Barbara, CA (US); Vinh Tran, San Jose, CA (US);
David Bothman, Santa Barbara, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days. days.

(21) Appl. No.: 15/597,419

(22) Filed: May 17, 2017

(51) Int. Cl.
*H05K 7/20* (2006.01)

(52) U.S. Cl.
CPC ....... *H05K 7/2039* (2013.01); *H05K 7/20336* (2013.01); *H05K 7/20854* (2013.01)

(58) Field of Classification Search
CPC ........ H05K 7/20; H05K 7/209; H05K 7/2039; H05K 7/20336; H05K 7/20409; H05K 7/20436; H05K 7/20445; H05K 7/20854; H05K 7/20863; H05K 7/20909; H05K 1/0203; H01L 23/34; H01L 23/38; H01L 23/40; H01L 23/42; H01L 23/367; H01L 23/3738; H01L 23/3736; H01L 3453/3677; G06F 1/206

USPC ............... 361/704–710, 717–720, 679.54; 277/359–360, 652–653, 718; 257/E23.101, 675, 720, 718; 165/80.2, 165/185; 174/252; 264/261, 263; 372/34, 36; 428/34; 439/153, 161; 438/122

See application file for complete search history.

(56) References Cited

U.S. PATENT DOCUMENTS

| | | | | |
|---|---|---|---|---|
| 4,821,147 A | * | 4/1989 | Jacobs | H05K 7/1404 211/41.17 |
| 5,371,753 A | * | 12/1994 | Adsett | H01S 5/02407 257/718 |
| 9,036,353 B2 | | 5/2015 | Buckman et al. | |
| 2006/0060328 A1 | * | 3/2006 | Ewes | H01L 23/427 165/80.2 |
| 2012/0061127 A1 | * | 3/2012 | Fields | H01L 23/373 174/252 |

(Continued)

*Primary Examiner* — Dion R Ferguson
*Assistant Examiner* — Amir Jalali
(74) *Attorney, Agent, or Firm* — John A. Miller; Shumaker, Loop & Kendrick, LLP

(57) ABSTRACT

A thermal transfer system for reducing temperature cycling of an electronic device. The thermal system includes a thermally conductive device to which the electronic device is mounted, a heat sink and a thermal rail mounted to the heat sink. The thermal system further includes a plurality of shape memory alloy (SMA) elements extending through aligned openings in the rail and the thermally conductive device, where the SMA elements are shaped in a deformed wire-like configuration and attempt to return to an undeformed spring-like configuration when the plurality of SMA elements are heated above a transition temperature so as to increase a heat transfer contact pressure between the thermally conductive device and the rail.

20 Claims, 2 Drawing Sheets

(56) References Cited

U.S. PATENT DOCUMENTS

2016/0266621 A1* 9/2016 Makinen ............... G06F 1/203
2017/0363073 A1* 12/2017 Tirca-Dragomirescu ..................
                                                    F03G 7/065

* cited by examiner

CONTROLLABLE CONDUCTANCE THERMAL INTERFACE

BACKGROUND

Field

This invention relates generally to a thermal interface between an electronic device and a heat sink and, more particularly, to a thermal interface between an electronic device and a heat sink, where the thermal interface includes one or more shape memory alloy (SMA) devices coupled to a thermal rail mounted to the heat sink and a thermally conductive device to which the electronic device is mounted, and where the SMA devices increase and decrease the contact pressure between the rail and the thermally conductive device depending on temperature so as to reduce thermal cycling of the electronic device.

Discussion

Solid-state electronic devices, such as large flip-chips, printed circuit boards (PCB), high-power application specific integrated circuits (ASICs), field programmable gate arrays (FPGA), etc., sometimes employ a fine-pitch ball grid array (BGA) or column grid array (CGA) interconnection possibly having several hundred or even a few thousand conductive balls or electrically conductive columns that provide the electrical connection between the device and the leads to the device, and also provide a mounting structure for the device.

These electronic devices generate heat as they operate, which if significant enough can have a damaging affect on the device either through loss of performance or actual physical damage to the device. As solid-state electronic devices get smaller and operate at higher power, the heat generated by the device becomes more of a concern. Thus, solid-state electronic devices often employ some type of thermal interface or heat sink that draws heat away from the device during its operation. Often times these heat sinks rely on the flow of air around the heat sink and the device to help reduce the temperature. However, for space-based electronic devices, where air does not exist, removing heat from electronic devices becomes more challenging. Heat sinks for space-based applications typically require the device to be coupled to a large thermally conductive structure that may be bolted or glued to the electronic device, and then to the spacecraft structure itself.

Because there usually is a significant coefficient of thermal expansion (CTE) mismatch between the thermally conductive heat sink structure being made of metal and the ceramic-based electronic device, the conductive structure and the electronic device expand differently when heated, which causes a lateral stress on the BGA or CGA. Additionally, CTE mismatch between the electronic device itself and the circuit board to which it is mounted is a similar issue, which is mainly driven by the total temperature changes that the device sees. More specifically, solder joint fatigue due to temperature cycling prematurely weakens and possibly destroys electronic interconnects. It is understood that thermal cycling issues exist any time components are repeatedly powered on and off, which is especially problematic for higher-power devices. Because space-based electronic circuits may undergo significant thermal cycling and are often subjected to significant vibrations, such as during launch, the stress on the BGA or CGA affects the life of the device, where eventually connections, such as solder joints, at the BGA or CGB will fail. While this effect is most pronounced on space-based electronics due to lack of simplistic, controllable cooling methods, i.e., fans, liquid cooling, etc., it is not exclusive to only space hardware.

Known attempts to prolong the life of electronic devices by mitigating the effects of thermal cycling typically include two main techniques, specifically redesigning or supporting solder joints to provide more adequate device life, or maintaining low thermal resistance paths to minimize thermal gradients, i.e., maintaining the thermal resistance of the device as low as possible. These approaches mainly assist problem areas known during the design phase of the device, and are typically less useful the less that is known about the power dissipation of the device and the higher the power dissipation of the device.

DETAILED DESCRIPTION OF THE EMBODIMENTS

The following discussion of the embodiments of the invention directed to a thermal transfer system employing SMA elements is merely exemplary in nature, and is in no way intended to limit the invention or its applications or uses. For example, the thermal transfer system of the invention may have application for space-based electronic devices. However, as will be appreciated by those skilled in the art, the thermal transfer system will have application to various other electronic devices.

As will be discussed in detail below, the present invention proposes employing one or more SMA elements that are coupled between a heat sink and a thermally conductive device to which an electronic device is mounted, where the SMA elements increase and decrease the pressure between the heat sink and the thermally conductive device in response to the temperature going above and below a transition temperature of the SMA elements so as to reduce the total temperature swing during thermal cycling of the electronic device and its electrical connections.

Figure 1:
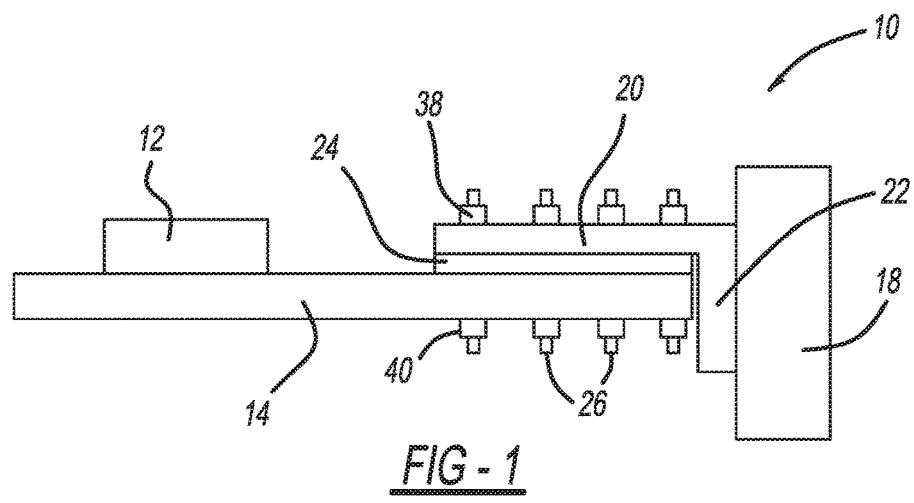
FIG. 1 is side view of a thermal interface system for an electronic device including a number of SMA elements provided between a thermally conductive device and a thermal rail.
Figure 2:
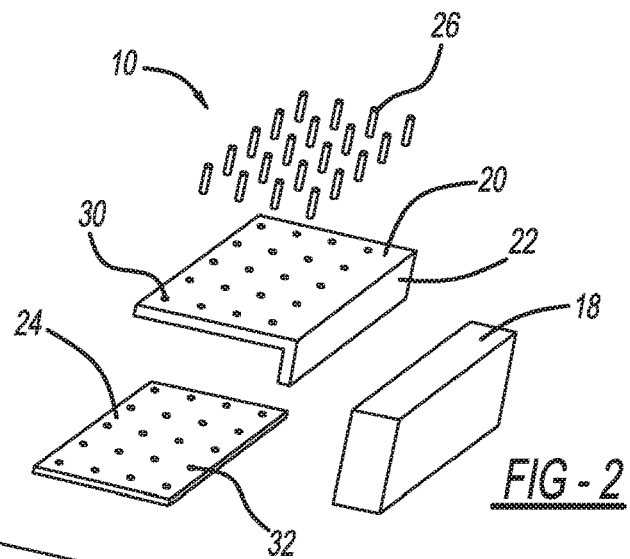
FIG. 2 is an exploded isometric view of the thermal interface system shown in FIG. 1.

FIG. 1 is a side view and FIG. 2 is an exploded, isometric view of a thermal transfer system 10 that is configured as discussed herein to reduce thermal cycling on an electronic device 12 and its electrical connections (not shown), such as solder joints. The electronic device 12 is intended to represent any electronic device that requires cooling, including both space-based electronic devices and terrestrial devices, such as any type of packaged electronic device. It is noted that the electronic device 12 is not shown in FIG. 2. The electronic device 12 is suitably mounted to a thermally conductive device 14 for the particular application, which can be any suitable heat removing element, such as a copper plate, a heat pipe, etc.

As is well understood by those skilled in the art, a heat pipe is a heat-transfer device that typically includes a sealed pipe or tube made of a high thermally conductive material, such as copper. A chamber within the heat pipe is partially filled with a wick structure and working fluid, such as water, where air is removed from the remaining volume of the chamber. The working fluid is a liquid at low temperature, and when it is heated by the device, turns into a vapor that travels through the chamber from a hot end of the pipe to a cold end of the heat pipe where it condenses back into a liquid. The liquid is then returned to the hot end of the heat pipe through the wicking material under capillary action that occurs as a result of the water being vaporized at the hot end. Large scale heat pipes are available as variable conductors, and are basically on or off, which requires power to be applied to change the state of the heat pipe and restrict the capillary action from happening. Further, variable conductance heat pipes are typically tubular, but electronic devices would typically benefit from planar or thermal ground plane heat pipes, which are not easily made variable due to the geometries of the heat pipe.

The heat generated by the electronic device 12 is transferred by the thermally conductive device 14 to a heat sink 18, which can be any suitable heat sink, such as a block of aluminum or copper, a spacecraft structure, etc. where the heat is dispersed. As mentioned, the object of the present invention is to reduce thermal cycling on the electronic device 12 so as to maintain it at a relatively constant temperature within reasonable limits. In order to accomplish this, the thermally conductive device 14 is selectively thermally coupled to a thermal rail 20 that is mounted to the heat sink 18 by, for example, bolts (not shown), a thermal adhesive layer (not shown), etc. In this specific embodiment, the rail 20 includes a vertical mounting portion 22 that expands the area that the rail 20 is coupled to the heat sink 18 for greater heat transfer. A thermally conductive flexible pad 24, such as a thin copper sheet, is provided between the thermally conductive device 14 and the thermal rail 20 so as to allow efficient transfer of heat therebetween, and provide a flexible barrier between the thermal device 14 and the rail 20 against vibrational loads, such as may occur during a space vehicle launch.

The amount of pressure applied between the thermally conductive device 14 and the rail 20 determines the amount of heat transfer therebetween, where the greater the pressure, the greater the amount of heat transfer. In order to reduce the thermal cycling, it is desirable to reduce the amount of heat transferred out of the electronic device 12 when it is relatively cool, for example, when the electronic device 12 is off, and increase the amount of heat transferred out of the device 12 when the device 12 is relatively hot, i.e., when the electronic device 12 is on. For many space-based electronic devices, the device typically has a ridged on/off cycle time, where the electronic device heats up and cools off at well understood intervals, thus increasing the ability of the system 10 to reduce thermal cycling.

In order to accomplish this, the system 10 includes a plurality of SMA elements 26, specifically wires, that are inserted into aligned holes in the rail 20, the pad 24 and the device 14, specifically holes 30, 32 and 34, respectively. As is well understood by those skilled in the art, an SMA is a material that is able to "remember" its original manufactured shape when it is heated above a certain transition temperature, which depends on the material. An SMA element is able to be deformed into a desirable shape when it is below the transition temperature for that element, and maintain that deformed configuration when it is below the transition temperature. When the SMA element is heated above the transition temperature, it will attempt to reconfigure its shape from the deformed configuration to its manufactured shape.

Figure 3:
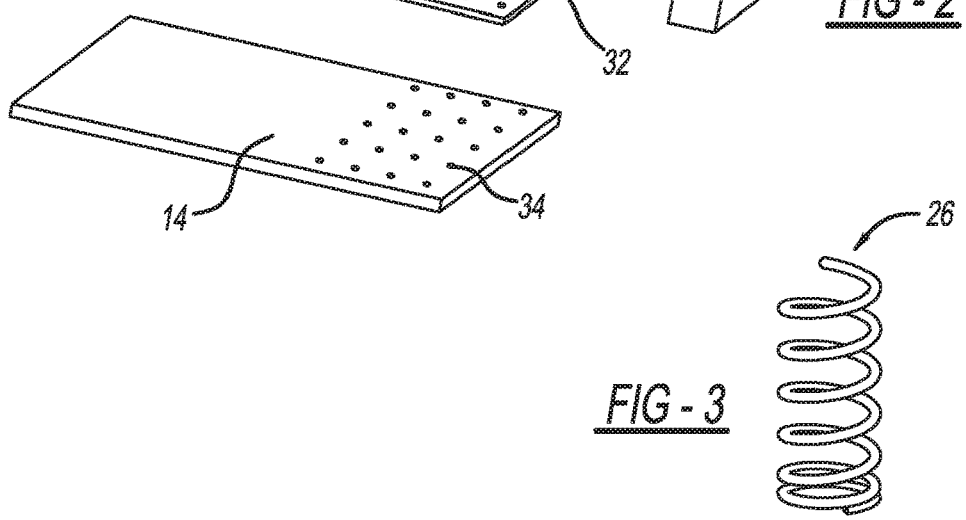
FIG. 3 is an isometric view of one of the SMA elements shown in an undeformed state.

The SMA elements 26 are manufactured in a suitable spiral shape, zig-zag shape, spring shape, etc., and then stretched (deformed) into wire and secured within the aligned holes 30, 32 and 34 in the deformed configuration. FIG. 3 is a side view of one of the SMA elements 26 shown in a spiral, undeformed configuration that shows a non-limiting example of a suitable manufactured shape. When the SMA elements 26 are heated above their transition temperature, they will attempt to return from the deformed elongated configuration of a wire to their spiral or zig-zag shape, such as shown in FIG. 3, which will provide significant pressure to attempt to pull the rail 20 and the conductive device 14 together, thus increasing the heat transfer from the device 12 to the heat sink 18. When the temperature then goes below the transition temperature, the SMA elements 26 will return to their deformed configuration, i.e., the wire, and reduce the contact pressure between the thermally conductive device 14 and the rail 20 to reduce the heat transfer, thus reducing the thermal cycling on the electronic device 12.

The SMA elements 26 can be secured within the holes 30, 32 and 34 in any suitable manner, such as by a suitable adhesive, so that they do no "pop out" of the holes 30, 32 and 34 when they return to their original configuration. In this non-limiting embodiment, a collar 38 is mounted to the elements 26 where they extend out of the rail 20 at one end and a collar 40 is mounted to the elements 26 where they extend out of the thermally conductive device 14 at an opposite end so as to hold the elements 26 within the holes 30, 32 and 34 and in place when they attempt to return to their manufactured shape. It is noted that the collars 38 and 40 are not shown in FIG. 2.

The SMA material of the elements 26 can be any suitable material for the purposes described herein, such as nickel titanium, often referred to as nitinol. Although the SMA elements 26 are shown as separate elements in this design, in an alternate design they may be part of a fastener, such as a bolt. The number of the SMA elements 26, the size of the SMA elements 26, etc. would depend on the specific application and the amount of heat transfer pressure desired.

Figure 4:
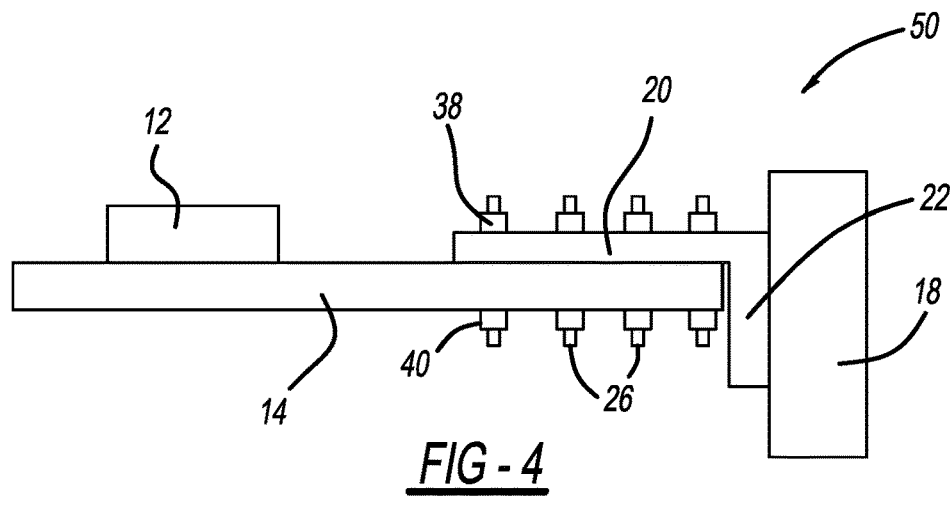
FIG. 4 is a side view of a thermal interface system for an electronic device similar to the thermal interface system shown in FIG. 1, but showing a thermal rail and a thermally conductive device in contact with each other.

As discussed above, the pad 24 is provided between the rail 20 and the thermally conductive device 14 to protect against vibrations. In an alternate embodiment, the pad 24 can be removed, and the rail 20 and the thermally conductive device 14 can be positioned in contact with each other. This embodiment is shown in FIG. 4 by thermal transfer system 50, where like elements to the system 10 are identified by the same reference number. The thermal transfer pressure between the thermally conductive device 14 and the thermal rail 20 operates in the same manner as discussed above.

Figure 5:
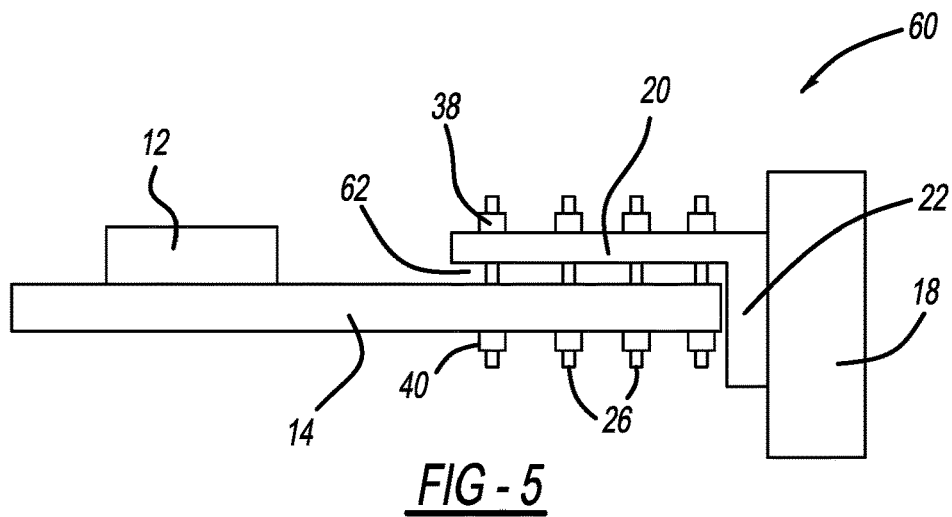
FIG. 5 is a side view of a thermal interface system for an electronic device similar to the thermal interface system shown in FIG. 1, but showing a gap between a thermal rail and a thermally conductive device.
Figure 6:
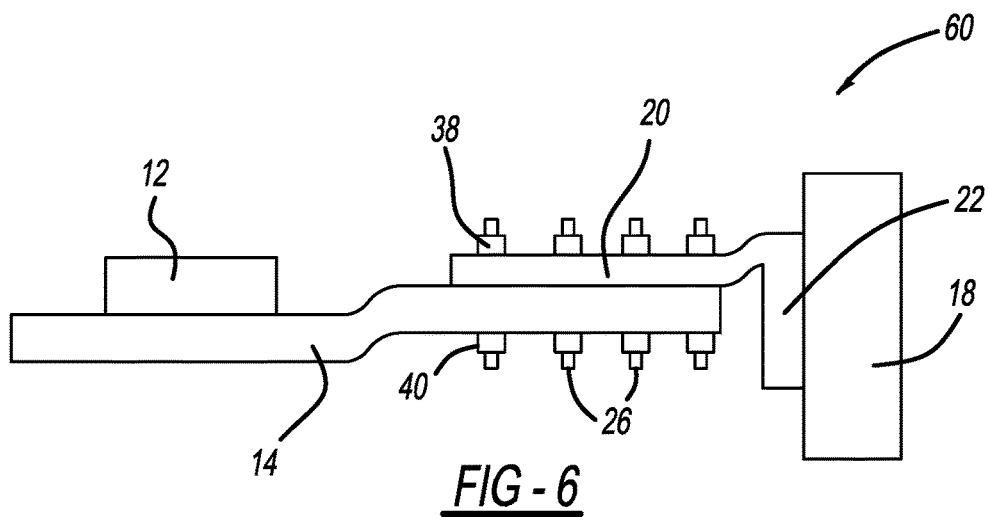
FIG. 6 is a side view of the thermal interface system shown in FIG. 5, where the gap has been closed in response to SMA element activation so that the thermal rail and thermally conductive device are in contact with each other.

In yet another embodiment, the pad 24 can be removed to define a gap between the rail 20 and the thermally conductive device 14 across which the SMA elements 26 extend. This embodiment is shown in FIG. 5 by thermal transfer system 60 including a gap 62 between the device 14 and the rail 20 across which the SMA elements 26 extend, where like elements to the system 10 are identified by the same reference number. In this embodiment, the rail 20 and the thermally conductive device 14 operate as a cantilever switch where there is no thermal contact between the rail 20 and the thermally conductive device 14 when the SMA elements 26 are below the transition temperature and in their deformed state. When the temperature of the SMA elements 26 increases above the transition temperature and they attempt to return to their undeformed, manufactured shape, the thermal rail 20 and the thermally conductive device 40 are bent and drawn together to close the gap 62 and make thermal contact with each other as shown in FIG. 6.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A thermal transfer system for controlling a temperature of an electronic device, said system comprising:
    a thermally conductive device to which the electronic device is coupled;
    a heat sink;
    a thermal rail mounted to the heat sink; and
    at least one shape memory alloy (SMA) element positioned in contact with the rail and the thermally conductive device, said at least one SMA element being shaped in a deformed configuration, and attempting to return to an undeformed configuration when the at least one SMA element is heated above a transition temperature so as to increase heat transfer between the thermally conductive device and the rail.

2. The system according to claim 1 wherein the at least one SMA element is configured into a wire-like shape in the deformed configuration and attempts to return to a spring-like shape in the undeformed configuration.

3. The system according to claim 1 wherein the at least one SMA element is a plurality of SMA elements.

4. The system according to claim 1 wherein the thermal rail and the thermally conductive device are in contact with each other when a temperature of the at least one SMA element is below the transition temperature, and wherein the at least one SMA element causes an increase in contact pressure between the rail and the thermally conductive device when the SMA element is heated above the transition temperature.

5. The system according to claim 1 further comprising a thermal pad position between and in contact with the thermal rail and the thermally conductive device where the at least one SMA element extends through the thermal pad, and wherein the at least one SMA element causes an increase in contact pressure between the rail and the thermally conductive device when the SMA element is heated above the transition temperature.

6. The system according to claim 1 wherein the thermal rail and the thermally conductive device are spaced apart from each other to define a gap therebetween when a temperature of the at least one SMA element is below the transition temperature, where the at least one SMA element extends across the gap, and wherein the at least one SMA element causes the thermal rail and the thermally conductive device to move in contact with each other to close the gap when the SMA element is above the transition temperature.

7. The system according to claim 1 wherein the thermally conductive device is a metal plate.

8. The system according to claim 1 wherein the thermally conductive device is a heat pipe.

9. The system according to claim 1 wherein the electronic device is a spacecraft device.

10. The system according to claim 9 wherein the heat sink is a spacecraft structure.

11. A thermal transfer system for controlling a temperature of an electronic device, said system comprising:
    a thermally conductive device to which the electronic device is coupled;
    a heat sink;
    a thermal rail mounted to the heat sink; and
    a plurality of shape memory alloy (SMA) elements positioned in contact with the rail and the thermally conductive device, said plurality of SMA elements being shaped in a deformed wire-like configuration and being positioned in aligned holes extending through the rail and the thermally conductive device, said plurality of SMA elements attempting to return to an undeformed spring-like shape when the plurality of SMA elements are heated above a transition temperature so as to increase a contact pressure between the thermally conductive device and the thermal rail to increase heat transfer from the electronic device to the heat sink, said plurality of SMA elements returning to the deformed wire-like configuration when a temperature of the plurality of SMA elements goes below the transition temperature so as to reduce the contact pressure between the thermal rail and the thermally conductive device to decrease the heat transfer from the electronic device to the heat sink and reduce thermal cycling of the electronic device.

12. The system according to claim 11 wherein the thermal rail and the thermally conductive device are in contact with each other when a temperature of the plurality of SMA elements are below the transition temperature.

13. The system according to claim 11 further comprising a thermal pad position between and in contact with the thermal rail and the thermally conductive device where the plurality of SMA elements extend through the thermal pad.

14. The system according to claim 11 wherein the thermal rail and the thermally conductive device are spaced apart from each other to define a gap therebetween, where the plurality of SMA elements extend across the gap when a temperature of the SMA elements are below the transition temperature, and wherein the plurality of SMA elements cause the thermal rail and the thermally conductive device to move in contact with each other to close the gap when a temperature of the plurality of SMA elements are above the transition temperature.

15. The system according to claim 11 wherein the thermally conductive device is a metal plate.

16. The system according to claim 11 wherein the thermally conductive device is a heat pipe.

17. The system according to claim 11 wherein the electronic device is a spacecraft device.

18. A thermal transfer system for controlling a temperature of a space-based electronic device, said system comprising:
    a thermally conductive device to which the electronic device is coupled;
    a heat sink;
    a thermal rail mounted to the heat sink;
    a thermal pad positioned between and in contact with the thermally conductive device and the thermal rail; and
    a plurality of shape memory alloy (SMA) elements positioned in contact with the rail and the thermally conductive device and extending through the thermal pad, said plurality of SMA elements being shaped in a deformed wire-like configuration and being positioned in aligned holes extending through the rail, the conductive pad and the thermally conductive device, said plurality of SMA elements attempting to return to an undeformed spring-like shape when the plurality of SMA elements are heated above a transition temperature so as to increase a contact pressure between the thermally conductive device and the thermal rail to increase heat transfer from the electronic device to the heat sink, said plurality of SMA elements returning to the deformed wire-like configuration when a temperature of the plurality of SMA elements goes below the transition temperature so as to reduce the contact pressure between the thermal rail and the thermally conductive device to decrease the heat transfer from the electronic device to the heat sink and reduce thermal cycling of the electronic device.

19. The system according to claim 18 wherein the thermally conductive device is a metal plate.

20. The system according to claim 18 wherein the thermally conductive device is a heat pipe.

\* \* \* \* \*